United States Patent [19] [11] 3,733,527
Migitaka et al. [45] May 15, 1973

[54] SEMICONDUCTOR DEVICE AND METHOD FOR MAKING THE SAME

[75] Inventors: Masatoshi Migitaka; Susumu Takahashi, both of Kokubnji; Hitoshi Sato, Nishitama; Hisao Nakashima; Shojiro Asai, both of Hachioji; Yuichi Ono, Kokubunji, all of Japan

[73] Assignee: Hitachi, Ltd., Tokyo, Japan

[22] Filed: July 22, 1971

[21] Appl. No.: 165,066

[30] Foreign Application Priority Data

July 22, 1970 Japan ............................45/63614
Aug. 12, 1970 Japan ............................45/70074

[52] U.S. Cl. ....317/235 R, 317/235 N, 317/235 AA, 317/235 AD, 317/235 AC, 317/235 AM, 148/176, 148/186
[51] Int. Cl. ..................................................H01l 3/20
[58] Field of Search ...................317/235 N, 235 AA, 317/234 V, 235 AD, 235 AC, 235 AM; 148/176, 186

[56] References Cited

UNITED STATES PATENTS

| | | | |
|---|---|---|---|
| 3,416,047 | 12/1968 | Beale | 317/234 |
| 3,508,126 | 4/1970 | Newman | 317/235 |
| 3,604,991 | 9/1971 | Yonezu | 317/235 R |
| 3,582,825 | 6/1971 | Migitoka | 331/107 G |
| 3,634,872 | 1/1972 | Umeda | 317/234 R |

*Primary Examiner*—Martin H. Edlow
*Attorney*—Craig, Antonelli & Hill

[57] ABSTRACT

A semiconductor device characterized in that an insulation layer of $SiO_2$, $SiO_2$-$P_2O_5$, $Si_3N_4$ or the like is deposited on a GaAs substrate through a mixed crystal layer of a ternary system comprising a $III_a$ group element (such as Al and In) or a $V_a$ group element (such as P and Sb), Ga and As. The semiconductor device is characterized in that, even when an impurity such as Zn is selectively diffused into the substrate through the mixed crystal layer, it is possible to prevent the impurity from being anomalously diffused along the boundary between the GaAs substrate and the insulation layer and to obtain a stabilized surface of the GaAs substrate.

7 Claims, 12 Drawing Figures

INVENTORS

MASATOSHI MIGITAKA, SUSUMU TAKAHASHI

HITOSHI SATO, HISAO NAKASHIMA,

SHOJIRO ASAI and YUICHI ONO

BY Craig, Antonelli & Hill

ATTORNEYS

INVENTORS
MASATOSHI MIGITAKA, SUSUMU TAKAHASHI,
HITOSHI SATO, HISAO NAKASHIMA,
SHOJIRO ASAI and YUICHI ONO BY
Craig, Antonelli & Hill
ATTORNEYS

SEMICONDUCTOR DEVICE AND METHOD FOR MAKING THE SAME

BACKGROUND OF THE INVENTION

1. Field of the Invention

This invention relates to an intermetallic semiconductor device formed on a GaAs substrate, and more particularly to an intermetallic semiconductor device having excellent characteristics, especially with respect to the breakdown voltage. The invention relates also to a method for making such intermetallic semiconductor device.

2. Description of the Prior Art

The $SiO_2$ layer, $SiO_2$-$P_2O_5$layer or $Si_3N_4$ layer, etc. has been in use as a coating on a GaAs crystal in order to stabilize the surface of the semiconductor device such as a p-n junction diode, a Gunn diode, etc.

It is known in the art that, when the insulation layer is deposited directly on the GaAs crystal, the latter acts on the insulation layer, thereby forming a high resistivity layer at the boundary between the insulation layer and the GaAs crystal. In this structure of semiconductor device, ions move in the high resistivity layer due to the electric field or an aging variation takes place due to the high resistivity layer and, as a result, the reverse current at the p-n junction is gradually increased, to lower the breakdown voltage and to reduce the life of the device.

To solve this problem, semiconductor devices having neither insulation coating nor stabilized surface have been used frequently. However, it is apparent that such a semiconductor device also is deteriorated due to absence of the coating of an insulation layer.

There are other conventional semiconductor devices which are formed in such a way that a mask is formed directly on the surface of the GaAs substrate in case, for example, $p^+$ - n junction, an $n^+$ - p junction, or a high-low junction such as an $n^+$ - n junction is formed on the GaAs substrate by the selective diffusion method, and a working layer or a low resistivity layer for installing electrodes is formed on a part of the substrate.

The mask used in generally of SiO, $SiO_2$, $SiO_2$-$P_2O_5$ (phosphosilicate glass), $Si_3N_4$ (silicon nitride) or $Al_2O_3$ (aluminum oxide), which is formed by chemical vapor depositition method, sputtering method or the like. In any such prior art method, the insulation layer for the masking is usually formed directly on the GaAs substrate. In some cases, the insulation layer is disposed in the form of multilayer for the purpose of controlling the stress of the insulation layer. In this case also, the insulation layer is formed directly on the GaAs substrate. The conventional semiconductor device having its insulation layer formed in the above manner gives rise to various problems. For example, in the semiconductor device having a nitride layer, the layer is deposited on the GaAs substrate at a temperature above 600°C and, hence, GaAs is decomposed on the surface of the GaAs substrate, and a reaction occurs between Ga and $N_2$ to form a GaN compound and to produce a yellow intermediate layer. This makes it difficult to control the selective diffusion or results in an anomalous substrate surface. While, in the semiconductor device in which an $SiO_2$ layer is formed directly on the GaAs substrate by the sputtering method, it is possible to realize relatively good characteristics of the layer, however, the surface of the substrate tends to be roughed by the sputtering.

In the structure having a phosphosilicate glass layer, the layer is formed by a process pursuant to which monosilane is thermally decomposed at a temperature below 400°C. At this temperature, GaAs is not decomposed. On the other hand, however, the diffusion layer beneath the phosphosilicate glass layer is spread in the lateral direction, thereby lowering the adhesion between the insulation layer and the substrate.

As described above, there are many drawbacks in the conventional semiconductor device in which an insulation layer is formed on the GaAs substrate, and an impurity is selectively diffused into the substrate through the insulation layer which is used as a mask. According to the prior art, the electrical characteristics such as the breakdown voltage characteristics thereof can hardly be improved.

SUMMARY OF THE INVENTION

In view of the foregoing, an object of this invention is to provide a long-life semiconductor device formed on a GaAs substrate having an insulation layer.

Another object of this invention is to provide an intermetallic semiconductor device which is formed on a GaAs substrate having an impurity diffusion layer disposed by way of a mask layer, operable at a high breakdown voltage and with excellent electrical characteristics.

Another object of this invention is to provide a method for making such characteristically excellent semiconductor devices.

Briefly, the semiconductor device of this invention is characterized in that an insulation layer of $SiO_2$, $SiO_2$-$P_2O_5$, $Si_3N_4$ or the like is deposited on a GaAs substrate through a mixed crystal layer of a ternary system comprising a $III_a$ group element (such as Al and In) or a $V_a$ group element (such as P and Sb), Ga and As.

The reason why a high resistivity layer is formed in the boundary between the insulation layer and the GaAs crystal is believed that the Ga content in GaAs is so active that Ga readily acts on the insulation layer. The results of experiments conducted by the inventors of this invention show that when an $Si_3N_4$ layer is formed on the GaAs crystal surface by chemical vapor deposition method, a reaction occurs between Ga and the insulation layer, to form a GaN layer, whereas, when an $Si_3N_4$ layer is deposited on the $GaAs_xP_{1-x}$ (where $0<x<1$), no GaN layer is formed. In other words, the Ga content in the mixed crystal layer is less active than that in the GaAs crystal. The expe iments also revealed that the element which can reduce the activity of the Ga content in the mixed crystal layer is not only P but also another $V_b$ element such as Sb and the $III_b$ elements such as Al and In.

The semiconductor device in accordance with the second object of this invention is realized in such a manner that a mixed crystal layer comprising a $III_a$ group element (such as Al and In) or a $V_a$ group element (such as P and Sb), Ga and As is disposed on the surface of a first conductivity type GaAs crystal, the known insulative diffusion mask member is formed on this mixed crystal layer and, by way of a window disposed through the mask member, an impurity of a second conductivity type opposite to the first conductivity type is diffused as far as into the GaAs crystal through the mixed crystal layer.

On the other hand, the semiconductor device in accordance with the third object of this invention is realized in such a manner that a mixed crystal layer of a ternary system comprising Ga, As and a $III_a$ group or $V_a$ element excepting for Ga and As is disposed on the surface of a first conductivity type GaAs crystal, an insulative diffusion mask member is formed on the mixed crystal layer and, by way of a window disposed through the mask member, a second conductivity type impurity is diffused as far as into the GaAs crystal through the mixed crystal layer.

The results of experiments conducted by the inventors of this invention show that when an $Si_3N_4$ layer is formed to a thickness of about 3,000A on the mixed crystal layer of $GaAs_{1-x}P_x$ ($0.1<x<0.6$) in the same manner as on the crystal layer of GaAs and, using this $Si_3N_4$ layer as a mask, a p-type impurity such as Zn or an n-type impurity such as Sn is diffused to a thickness of 4$\mu$ by the closed tube method, no high resistivity layer is produced in the boundary between the $Si_3N_4$ and the $GaAs_{1-x}P_x$ crystals. Another experimental result shows that when an $Si_3N_4$ layer is formed on the Ga-$As_{1-x}P_x$ layer at a temperature of about 600° to 800°C, no compound is formed between the insulation layer and Ga or As or P. This phenomenum is observed not only for P but also for the other $V_a$ group elements and the $III_a$ group elements such as Al. It is understood that this is because the $III_b$ and $V_b$ group elements are strongly combined with the component elements of GaAs and, as a result, the activity of the component elements of GaAs to react on other impurities is substantially lowered.

The composition between the GaAs substrate crystal and the mixed crystal may be changed discontinuously. However, it is desirable that this composition be continuously changed in order to minimize the stresses due to the difference in the physical nature between the GaAs substrate crystal and the mixed crystal.

It is also desirable that the impurity concentration be lower in the mixed crystal layer than in the GaAs substrate crystal.

Other objects, features and advantages of the invention will be illustrated by the following nonlimitative examples taken in conjunction with the accompanying drawings.

DESCRIPTION OF THE PREFERRED EMBODIMENTS

Example 1

Figure 1:
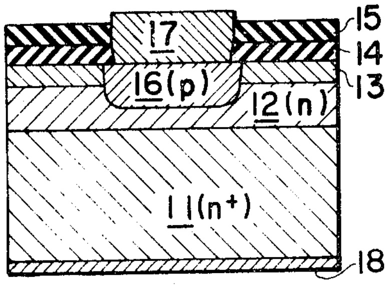
FIG. 1 is a cross sectional view showing a semiconductor diode of this invention having a thin layer of mixed crystal and an insulation layer.
Figure 2A:
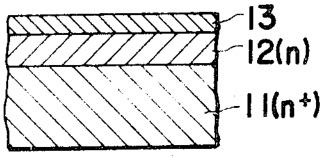
FIGS. 2*a* through 2*d* illustrate the successive steps of a process for making the semiconductor device as shown in FIG. 1.
Figure 2B:
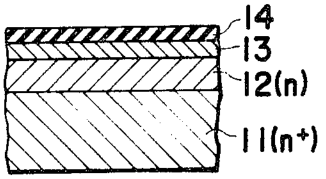
Figure 2C:
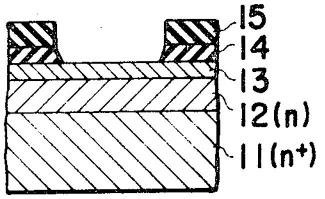
Figures 3A, 3B:
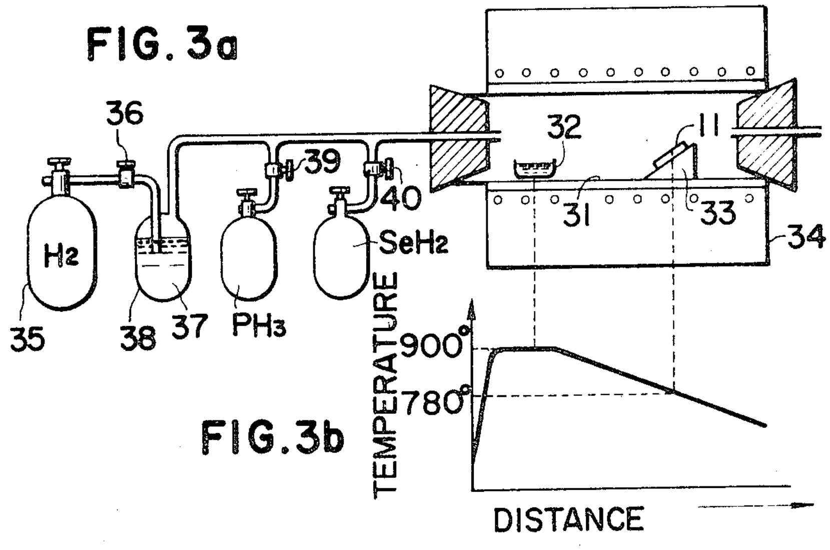
FIG. 3*a* is a schematic diagram showing an apparatus used in the process as shown in FIGS. 2*a* through 2*d*.
FIG. 3*b* is a graphic representation showing the temperature distribution in the apparatus of FIG. 3*a*.

An embodiment of this invention will be illustrated by referring to FIGS. 1, **2*a* through 2*d*, 3*a* and 3*b*. An n-type GaAs epitaxial layer 12 with an impurity concentration of about $8 \times 10^{16}cm^{-3}$ is formed to a thickness of about 3$\mu$ on a (100) plane of an $n^+$ type GaAs substrate 11 with an impurity concentration of about $2 \times 10^{18}cm^{-3}$ by using an apparatus as shown in FIG. 3*a*. Similarly, a 2$\mu$ thick GaAsP layer 13 is formed on the epitaxial layer 12. This structure is shown in FIG. 2*a*. Referring to FIG. 3*a*, reference numeral 31 denotes a quartz reaction tube. An amount of gallium 32 is placed in a first region, and the GaAs substrate 11 is placed as a crystal seed in a second region. This crystal seed is placed aslant on a sample table 33 made of a suitable material such as, for example, quartz, in order to make the thickness of the vapor growth layer uniform. The reaction tube is heated to the temperature shown in FIG. 3*b* by an electric oven 34. The temperature of the gallium source 32 is 900°C, and that of the seed crystal is 780°C. Then hydrogen gas is supplied from a high purity hydrogen source 35 to an evaporator 38 containing $AsCl_3$ 37 by way of a valve 36 whereby the $AsCl_3$ vapor is mixed with the hydrogen gas. The mixed vapor is then introduced into the reaction tube 31. As a result thereof, the GaAs epitaxial layer 12 is formed on the GaAs substrate 11. In this process, a suitable amount of $SeH_2$ is mixed with the hydrogen gas by way of a valve 40, thereby providing the GaAs epitaxial layer 12 with an n-type conductivity. When the n-type GaAs epitaxial layer 12 is formed to a predetermined thickness, a valve 39** is gradually opened to introduce $PH_3$ vapor into the hydrogen gas. In this process, the amount of P contained in GaAsP can be arbitrarily controlled. In this embodiment, three samples, $GaAs_{0.6}P_{0.4}$, $GaAs_{0.7}P_{0.3}$ and $GaAs_{0.8}P_{0.2}$ were produced.

In the next step, a silicon nitride layer 14 is deposited on the GaAsP layer 13. This silicon nitride layer 14 is formed from $SiH_4$ and $NH_3$ by the known high frequency heating process. The thickness of the silicon nitride layer 14 is controlled to about 1,000 to about 1,500A at a temperature of about 700°C. This structure is shown in FIG. **2*b***.

A $SiO_2$-$P_2O_5$ (phosphosilicate glass) layer 15 is formed on the silicon nitride layer 14. This phosphosilicate glass layer is used also as the mask for etching the silicon nitride layer 14. More particularly, a hole with a 15$\mu$ diameter is formed in the $SiO_2$-$P_2O_5$ layer 15 by photoresist technique, and the silicon nitride layer 14 is then etched through the etching mask, constituted by the $SiO_2$-$P_2O_5$ layer 15, whereby part of the GaAsP layer 13 is exposed. This structure is shown in FIG. **2*c***.

Figure 2D:
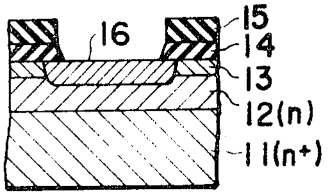

Then a p-type impurity Zn is diffused into the sample by the known closed tube method. In this process, the diffusion source Zn, polycrystal GaAs and the sample are enclosed in a quartz ampoule, the ampoule is vacuum-sealed, and Zn is diffused at 700°C for 4 hours whereby the impurity penetrates through the GaAsP layer 13 and spreads as far as into the n-type GaAs epitaxial layer 12 and thus a 3$\mu$ thick diffusion layer 16 is formed. The resultant structure, as shown in FIG. 2d, is a p-n junction diode. Then an ohmic electrode 17 whose contact area is smaller than the transversal area of the diffusion layer 16 is installed on the p-n junction diode and another ohmic electrode 18 is disposed on the base of the substrate whereby a semiconductor device as shown in FIG. 1 is obtained.

In the sample of $GaAs_{0.6}P_{0.4}$, the reverse current measured is $10^{-8}$ ampere, and the breakdown voltage is 24 volts. In the sample of $GaAs_{0.8}P_{0.2}$, the reverse current is less than $10^{-10}$ ampere, and the breakdown voltage is 24 volts. This breakdown voltage is higher by 7 volts than in the conventional semiconductor device having no GaAsP layer.

Example 2

Figure 4:
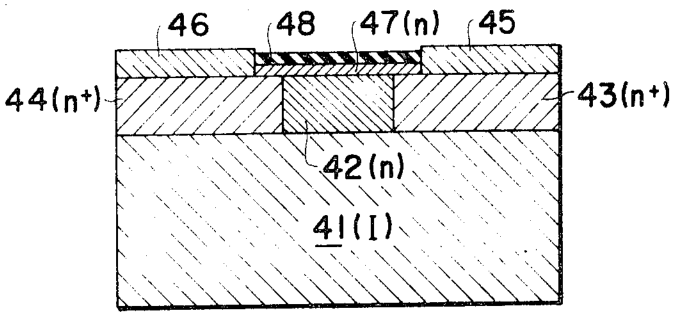
FIG. 4 is a cross sectional view showing a Gunn diode embodying this invention.

Referring to FIG. 4, there is shown a surface-stabilized planar GaAs Gunn Diode in accordance with this invention.

A high purity n-type GaAs layer with an impurity concentration of $2 \times 10^{15}cm^{-3}$ is formed to a thickness of $10\mu$ on a Cr-doped semiinsulative GaAs substrate crystal 41 with a specific resistance of $5 \times 10^{8}\Omega$-cm by the known epitaxial growth method using a $Ga/AsCl_3/H_2$ system as in the example 1. The growth temperature is 750°C. An $SiO_2$ layer is formed on the n-type GaAs layer by chemical vapor deposition method. A photoresist layer is formed on the $SiO_2$ layer. Using this photoresist layer, all the $SiO_2$ layer, excepting a $50\mu$ wide area across the top surface of the underlying crystal, is removed by using HF. Then, using the remaining $SiO_2$ layer as a mask, the n-type GaAs layer, excepting the area 42, is removed by using an etching solution comprising $H_2SO_4$, $H_2O_2$ and $H_2O$ at the ratio of 4:1:1. Again, using the remaining $SiO_2$ layer as a mask, $n^+$ GaAs layers 43 and 44 are selectively formed on the substrate 41 on the two sides of the part 42 by the liquid growth method. The purpose of the $n^+$ GaAs layers is to permit electrodes 45 and 46 to establish desired ohmic contact with these GaAs layers 43 and 44, respectively. The electrodes 45 and 46 are installed so as not to come into contact with the n-type layer 42. The liquid growth of GaAs layers 43 and 44 is done by the so-called Nelson's method, in which an Sn solution, saturated with GaAs, is applied to the crystal 41, and the sample is cooled gradually from 600°C whereby recrystallized GaAs layers 43 and 44 are grown on the surface of the crystal 41.

Then the $SiO_2$ layer is removed by using HF, and an n-type $Ga_xAl_{1-x}As$ layer 47 with an impurity concentration of $1 \times 10^{15}cm^{-3}$ is formed on the whole surface of the sample by liquid growth method. The value of $x$ in this embodiment is 0.8. The n-type layer 47 is formed by the Nelson's method in which a Ga/Al mixture solution, saturated with GaAs, is used and a crystal of GaAlAs is recrystallized. The growth temperature is 750°C. An $SiO_2$ layer is deposited on the n-type $Ga_xAl_{1-x}As$ layer 47 to a thickness of about 3,000A by chemical vapor deposition method. A photoresist layer is placed on the $SiO_2$ layer. Using This photoresist layer as a mask, all the $SiO_2$ layer, excepting a $70\mu$ wide area 48, is removed by using HF. In this process, the mask position is set so that the n-type GaAs layer 42 comes to be disposed accurately below the remaining $SiO_2$ layer 48. Using the remaining $SiO_2$ layer 48 as a mask, the n-type $Ga_xAl_{1-x}As$ layer, excepting the area covered by the mask, is removed by an etching solution comprising $H_2SO_4$, $H_2O_2$ and $H_2O$ at the ratio of 4:1:1. Then, using an evaporation mask, an Au· Sn alloy with 20% Sn is deposited by evaporation on only the part where the n-type $Ga_xAl_{1-x}As$ layer is removed. Then ohmic electrodes 45 and 46 are formed on the $n^+$ GaAs layers 43 and 44 respectively by an alloying process in a hydrogen atmosphere at 450°C for 10 minutes.

In the planar GaAs Gunn diode, as illustrated in FIG. 4, the insulative $SiO_2$ layer 48 is disposed on the GaAs crystal not directly but by way of an n-type $Ga_xAl_{1-x}As$ layer 47. The characteristics of this Gunn diode are shown in Table 1, in comparison with the conventional planar GaAs Gunn diode, structurally similar to that shown in FIG. 4, excepting that in the conventional planar GaAs Gunn diode, the $SiO_2$ layer 48 is disposed directly on the GaAs regions 42, 43 and 44 as in FIG. 4.

TABLE 1

| | Conventional Device | Device of this Invention |
|---|---|---|
| Breakdown Voltage | 150V | 300V |
| Life | 5,000 hrs. | 20,000 hrs. |

From Table 1, it is apparent that the invention makes it possible to increase the breakdown voltage and to extend the life of planar type GaAs Gunn diode.

Example 3

Figure 5A:
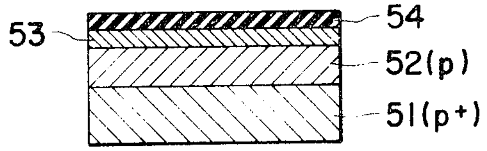
FIGS. 5*a* through 5*d* illustrate steps of a process for making a semiconductor device according to this invention.

Referring to FIGS. 5*a* through 5*d*, there is shown another embodiment of this invention, wherein a p-type GaAs epitaxial layer 52 which is doped with Zn at a concentration of about $2 \times 10^{17}cm^{-3}$ is disposed on a GaAs substrate 51 with $p^+$ type high impurity concentration, and a $GaAs_{0.6}P_{0.4}$ epitaxial growth layer 53 about $2\mu$ in thickness is disposed on the GaAs layer 52. An $SiO_2$ layer 54 is deposited on the epitaxial layer 53 to a thickness of about 4,000A at 450°C by chemical vapor deposition method. This structure is shown in FIG. 5*a*.

Figure 5B:
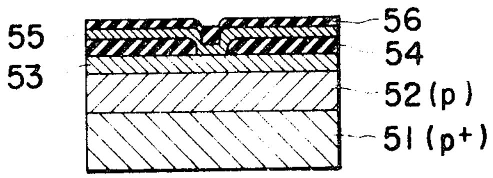
Figure 5C:
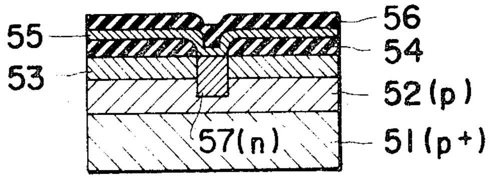

Then a hole with a diameter of $100\mu$ is formed through the $SiO_2$ layer 54 by photoresist technique, and $Ga_2S_3$ is deposited to a thickness of about 2,000A on the whole surface of the $SiO_2$ layer 54 by filament-heating evaporation in a vacuum of $1 \times 10^{-6}$mmHg. In FIG. 5*b* reference numeral 55 indicates this $Ga_2S_3$ layer. Another $SiO_2$ layer 56 is deposited on the $Ga_2S_3$ layer to about 4,000A in thickness in the same manner as used for the formation of the $Ga_2S_3$ layer. Then the diffusion is carried out by the open tube method at a diffusion temperature of 900°C for 6 hours and 30 minutes whereby a $4\mu$ thick n-type diffusion layer 57 is formed. This structure is shown in FIG. 5c.

Figure 5D:
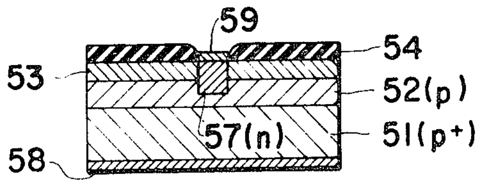

After this process the $SiO_2$ layer 56 is removed as shown in FIG. 5*d*, and then the $Ga_2S_3$ layer 55 is removed by the use of an NaOH solution. Ohmic contact layers 58 and 59 are installed on the p-side substrate and on the selectively diffused n-type diffusion layer 57 respectively.

Thus, in this semiconductor device, the n-typ diffusion is not spread laterally, and a desired p-n junction with a smooth junction plane is realized.

While we have shown and described several embodiments in accordance with the present invention, it is understood that the same is not limited thereto, but is susceptible of numerous changes and modifications as known to those skilled in the art, and we therefore do not wish to be limited to the details shown and described herein but intend to cover all such changes and modifications as are encompassed by the scope of the appended claims.

We claim:

1. A semiconductor device comprising:

a GaAs substrate,

A GaAs epitaxial layer of same conductivity type as that of said substrate, disposed on said substrate, the specific resistance of said epitaxial layer being higher than that of said substrate, a mixed crystal layer disposed on said epitaxial layer and consisting of Ga, As, and at least an element which is selected from the group consisting of the elements belonging to $III_a$ and $V_a$ groups of the periodic table except for Ga and As, the conductivity type of said mixed crystal layer being the same as that of said epitaxial layer, an impurity diffused layer extending through said mixed crystal layer, said impurity diffused layer being of opposite conductivity type to that of said epitaxial layer and so disposed that it protrudes into said epitaxial layer, thereby forming a p-n junction between said impurity diffused layer and said epitaxial layer, an ohmic contact disposed on said impurity diffused layer, a protecting layer disposed on said mixed crystal layer for preventing said mixed crystal layer from being exposed to the atmosphere, and an ohmic contact disposed on the opposite surface of said substrate with respect to the surface, where said impurity diffused layer is disposed, thereby forming a diode.

2. A semiconductor device according to claim 1, wherein said ohmic contact disposed on said impurity diffused layer is smaller than the surface of said impurity diffused layer, so that last-mentioned ohmic contact does not contact with said mixed crystal layer outside said impurity diffused layer.

3. A semiconductor device according to claim 1, wherein said protecting layer contains silicon.

4. A semiconductor device according to claim 2, wherein said protecting layer contains silicon.

5. A semiconductor device according to claim 4, wherein the composition of said mixed crystal layer varies gradually so that the content of said element, which is selected from the group consisting of the elements belonging to the $III_a$ and $V_a$ groups of the periodic table except for Ga and As, increases with the distance from said epitaxial layer.

6. A semiconductor device comprising:

a GaAs substrate having a very high electric resistance;

a GaAs epitaxial layer of one conductivity type disposed on said substrate and consisting of three regions juxtaposed to one another, the center region of said epitaxial layer having two side surfaces, each of which contacts with one of the side regions, all of said regions having a substantially equal thickness, said center region having a lower resistance than said substrate, said two side regions having a still lower resistance than said center region, a mixed crystal layer covering substantially the whole upper surface of said center region and a part of said side regions, and consisting of Ga, As, and at least an element which is selected from the group consisting of the elements, belonging to $III_a$ and $V_a$ groups of the periodic table except for Ga and As, the electric resistance of said mixed crystal layer being as high as that of said substrate, and two ohmic contacts disposed on the upper surface of each of said side regions respectively so that said ohmic contacts and said mixed crystal layer cover completely the upper surface of said epitaxial layer and that none of said ohmic contacts touches said center region, thereby forming a Gunn-diode.

7. A semiconductor device according to claim 6, wherein the composition of said mixed crystal layer varies gradually so that the content of said element, which is selected from the group consisting of the elements belonging to the $III_a$ and $V_a$ groups of the periodic table except for Ga and As, increases with the distance from said epitaxial layer.

* * * * *